Sept. 10, 1957 W. C. ESPENLAUB 2,806,211

HIGH-FREQUENCY WAVE-SIGNAL TUNING DEVICE

Filed Feb. 26, 1953 2 Sheets-Sheet 1

HIGH-FREQUENCY WAVE-SIGNAL TUNING DEVICE

Filed Feb. 26, 1953 2 Sheets-Sheet 2

United States Patent Office 2,806,211

Patented Sept. 10, 1957

2,806,211

HIGH-FREQUENCY WAVE-SIGNAL TUNING DEVICE

Walter C. Espenlaub, Great Neck, N. Y., assignor to Hazeltine Research, Inc., Chicago, Ill., a corporation of Illinois Application February 26, 1953, Serial No. 339,094

3 Claims. (Cl. 333—82)

*General*

This invention relates to high-frequency wave-signal tuning devices and, more particularly, to such devices of the type including a high-frequency wave-signal transmission line tunable by a reactive tuning means displaceable therealong. This type of tuning device is particularly useful in a television receiver and, accordingly, will be described in that environment.

One high-frequency wave-signal tuning device heretofore proposed, described in the copending application of Meyer Press, Serial No. 159,423, entitled "High-Frequency Wave-Signal Tuning Device," filed May 2, 1950, now Patent No. 2,717,362, issued September 6, 1955, utilizes a reactive tuning means displaceable along an impedance discontinuity portion of a tunable transmission line and comprising, for example, a capacitive tuning slug having an end portion attenuated to provide a desired frequency displacement tuning characteristic for the device. Although this device is entirely satisfactory for many applications, the tuning range thereof may be more limited than is desirable in some cases. Moreover, to provide a sufficiently wide tuning range for some applications in which a predetermined tuning characteristic is desired of the tuning device, the device may require the use of a capacitive tuning slug which must be spaced in close proximity to the transmission-line conductors over part of the tuning range, thereby rendering the device subject to criticalness of design and possibility of voltage breakdown.

Another type of tuning device has been proposed which may be tuned over a wide frequency band but which does not facilitate selection of a desired frequency displacement tuning characteristic and, additionally, may undesirably oscillate in spurious modes.

It is an object of the present invention, therefore, to provide a new and improved high-frequency wave-signal tuning device which avoids one or more of the above-mentioned limitations of such devices heretofore proposed.

It is another object of the invention to provide a new and improved high-frequency wave-signal tuning device which is tunable over a wide frequency band.

It is another object of the invention to provide a new and improved high-frequency wave-signal tuning device which is simple in construction and yet provides a desired frequency displacement tuning characteristic over a wide frequency band.

It is another object of the invention to provide a new and improved high-frequency wave-signal tuning device of simple construction which provides an approximately linear frequency displacement tuning characteristic over a wide frequency band.

In accordance with a particular form of the invention, a high-frequency wave-signal tuning device tunable over a wide frequency band comprises a high-frequency wave-signal transmission line including a pair of substantially parallel elongated conductors having an open end portion. A pair of tapered conductive sleeves longitudinally displaceable along the open end portion of the conductors comprises inductance elements having distributed capacitance therebetween and distributed inductance along the length thereof. The high-frequency wave-signal tuning device further includes a conductive inductance element connected to one end of each of the sleeves. The inductance elements have a self-resonant frequency higher than the highest frequency in the frequency band. The sleeves also comprise, in cooperation with the conductors, capacitance elements having an effective capacitive reactance of the same order of magnitude as the effective inductive reactance of the inductance elements at a position of the inductance and capacitance elements within their range of displacement. At least one of the inductance and capacitance elements has a value variable with displacements thereof. The inductance and capacitance elements further have an effective resultant impedance variable with displacements thereof for tuning the transmission line over the wide frequency band.

For a better understanding of the present invention, together with other and further objects thereof, reference is had to the following description taken in connection with the accompanying drawings, and its scope will be pointed out in the appended claims.

Figure 1:
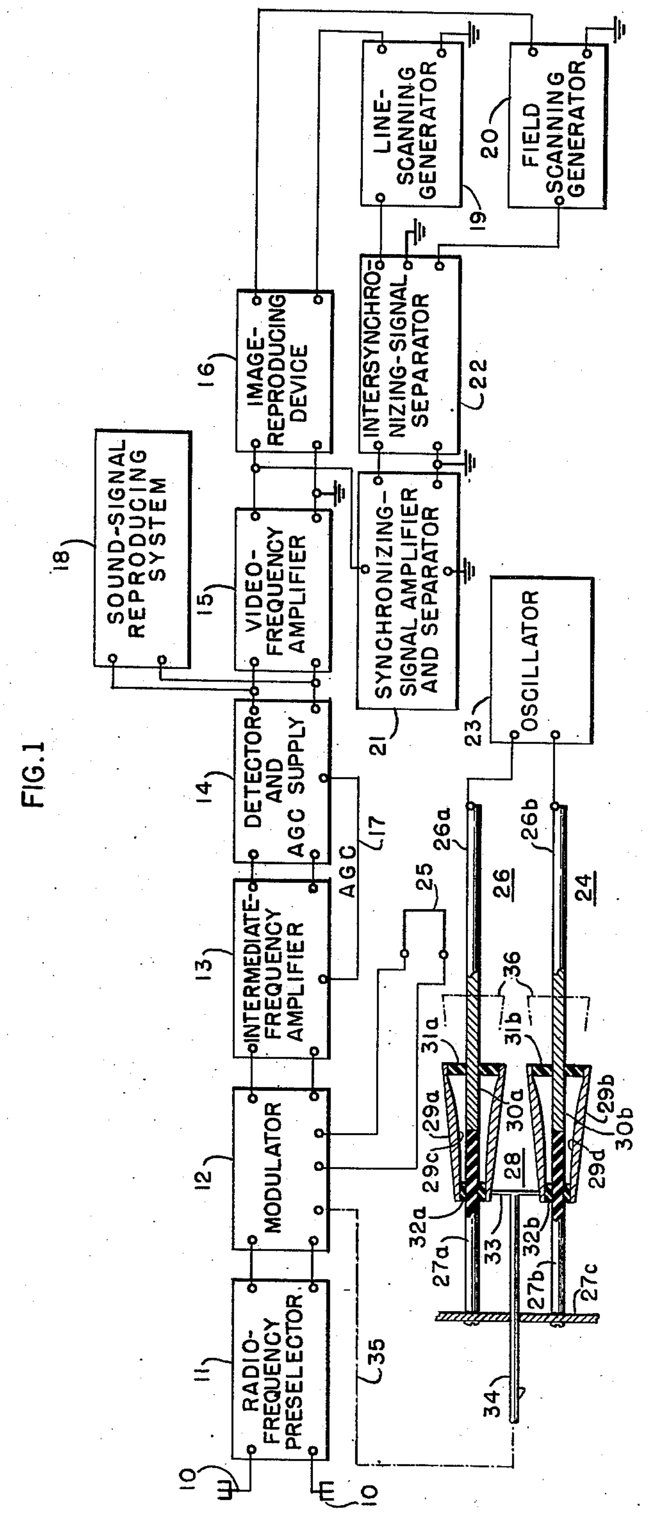
Fig. 1 is a circuit diagram, partly schematic, of a complete television receiver including a high-frequency wave-signal tuning device constructed in accordance with the invention.
Figure 2:
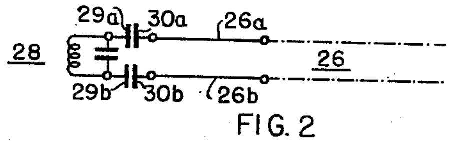
Fig. 2 is an equivalent circuit diagram of the above-mentioned tuning device of the Fig. 1 receiver.
Figure 2A:
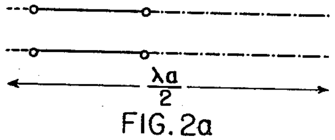
Figure 2B:
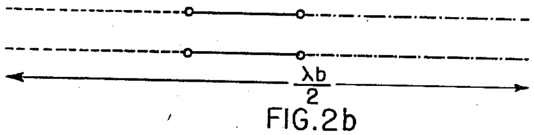
Figure 2C:
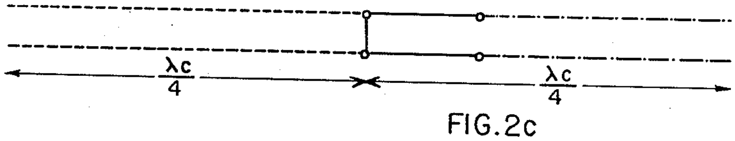
Figure 2D:
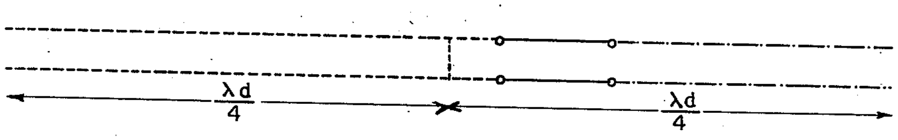

Fig. 2*a* is a diagrammatic representation of the tuning device of the Fig. 1 receiver utilizing a first tuning means and tuned to the highest frequency in the tuning range thereof;

Fig. 2*b* is a diagrammatic representation of the tuning device of the Fig. 1 receiver utilizing the first tuning means and tuned to the lowest frequency in the tuning range thereof;

Fig. 2*c* is a diagrammatic representation of the tuning device of the Fig. 1 receiver utilizing a second tuning means of different proportioning and tuned to an intermediate frequency in the tuning range thereof, and Fig. 2*d* is a diagrammatic representation of the tuning device of the Fig. 1 receiver utilizing the second tuning means and tuned to the lowest frequency in the tuning range thereof.

*General description of Fig. 1 television receiver*

Referring now more particularly to Fig. 1 of the drawings, there is represented a complete television receiver comprising an antenna system 10, 10 to which are coupled, in cascade and in the order named, a radio-frequency preselector 11, a modulator 12, an intermediate-frequency amplifier 13, of one or more stages, a detector and automatic-gain-control or AGC supply 14, a video-frequency amplifier 15, of one or more stages, and an image-reproducing device 16 which may comprise a cathode-ray tube. The AGC supply of the unit 14 is connected to the input circuits of one or more stages of the intermediate-frequency amplifier 13 by a control circuit conductor 17. A conventional sound-signal reproducing system 18 is connected to the output terminals of the detector of unit 14.

The output circuit of the video-frequency amplifier 15 is coupled to the input circuits of a line-scanning generator 19 and a field-scanning generator 20 through a synchronizing-signal amplifier and separator 21 and an inter-synchronizing-signal separator 22. The output circuits of the generators 19 and 20 are connected in a conventional manner to the scanning circuits of the image-reproducing device 16.

The receiver also includes a local oscillator 23 connected to a high-freqency wave-signal tuning device 24 constructed in accordance with the invention and described in detail hereinafter. The tuning device 24 comprises a tunable resonant circuit for the oscillator 23 and is coupled to the mixer of the unit 12 by a coupling loop 25 for applying a heterodyning signal to the mixer.

The antenna system 10, 10, the coupling loop 25, units 11–16, inclusive, the connection of conductor 17, and units 18–23, inclusive, with the exception of the tuning device 24 of the oscillator 23, may all be of conventional construction and operation so that a detailed description and explanation of the operation thereof are unnecessary herein.

*General operation of Fig. 1 television receiver*

Considering briefly, however, the general operation of the above-described receiver as a whole, television signals intercepted by the antenna system 10, 10 are selectively applied by the preselector 11 to the modulator 12. A heterodyning signal developed by the oscillator 23 is also applied to the modulator 12 by the coupling loop 25. The modulator 12 then derives from the signals applied thereto intermediate-frequency signals which, in turn, are selectively amplified in the intermediate-frequency amplifier 13 and are applied to the detector and automatic-gain-control supply 14. The detector of the unit 14 derives the video-frequency components of the intermediate-frequency signals and supplies those components to the video-frequency amplifier 15 for amplification. The video-frequency amplifier 15 applies the amplified video-frequency components to a beam-intensity-control input circuit of the image-reproducing device 16. A control potential derived by the automatic-gain-control supply of the unit 14 is applied as an automatic-gain-control bias to the gain-control circuit of the intermediate-frequency amplifier 13 to maintain the input signal to the detector of the unit 14 within a relatively narrow amplitude range for a wide range of received signal intensities.

The synchronizing-signal amplifier and separator 21 selects the synchronizing-signal components from the other signal components applied thereto by the video-frequency amplifier 15. The line-synchronizing and field-synchronizing signals derived by the separator 21 are separated from each other by the intersynchronizing-signal separator 22 and are supplied to the generators 19 and 20, respectively, to synchronize the operation thereof. The line-scanning and field-scanning generators 19 and 20 generate saw-tooth signals which are applied to the scanning circuits of the image-reproducing device 16, thereby to deflect the cathode-ray beam of the device 16 in two directions normal to each other to trace a rectilinear scanning pattern on the display screen of the device and, thus, reconstruct the translated picture.

The detector of unit 14 applies the sound intermediate-frequency signal to the unit 18 wherein it is amplified and the audio-frequency modulation components thereof are derived and converted to sound in a conventional manner.

*Description of tuning device of Fig. 1 television receiver*

Considering now the tuning device 24 of the Fig. 1 receiver in detail, that device comprises a high-frequency wave-signal transmission line 26 preferably having an effective electrical length approximately equal to one-half wave length at the highest frequency in the tuning range of the device. The transmission line 26 includes a pair of substantially parallel elongated conductors 26*a*, 26*b*, shown partially in cross section, forming an open ended transmission line. The conductors 26*a*, 26*b* are supported at one end thereof by suitable lengths of insulating material 27*a*, 27*b*, respectively, shown partially in cross section, made of, for example, polystyrene and attached to a supporting member 27*c*. The member 27*c* preferably is a fragmentary portion of a housing (not shown) for the device 24 for shielding the same from, for example, stray electrical disturbances. Capacitive loading of the transmission line 26 by circuits of the oscillator 23 also effectively lengthens the transmission line 26. The length of transmission line represented by circuits of the oscillator 23 has been found to increase in effective inch measurement as the frequency of the tuning device decreases.

The tuning device also includes reactive tuning means 28 coupled between the conductors 26*a*, 26*b* and longitudinally displaceable therealong and comprising inductance means and, in cooperation with the transmission line, capacitance means having effective reactances of the same order of magnitude at a position of the inductance and capacitance means within their range of displacement. More particularly, there is provided a pair of capacitance elements preferably comprising a pair of tapered conductive sleeves 29*a*, 29*b*. The sleeves 29*a*, 29*b* have inner surfaces 29*c*, 29*d*, respectively, which effectively serve as condenser plates separated by, for example, air dielectric from corresponding condenser plates comprising primarily the regions 30*a*, 30*b* of the transmission-line conductors 26*a*, 26*b*, respectively, adjacent the sleeves 29*a*, 29*b*, respectively, and shown in cross section. There are, of course, capacitive end effects between the inner surfaces of the sleeves 29*a*, 29*b* and the regions of the conductors 26*a*, 26*b*, respectively, not overlapping or engaged therewith so that much of the surfaces of the conductors 26*a*, 26*b* shown in full section may serve as condenser plates contributing to the total capacitance to a lesser extent than the regions 30*a*, 30*b*. Similarly, portions of the inner surfaces 29*c*, 29*d* of the sleeves 29*a*, 29*b*, respectively, not overlapping the conductors 26*a*, 26*b* contribute to the total capacitance to a lesser extent than the overlapping portions.

The inductance means comprises, for example, a metallic rod 33 of circular cross section conductively connected to one end of the sleeves 29*a*, 29*b*. The inductance means also includes the sleeves 29*a*, 29*b* which may contribute substantially to the total inductance because of the distributed inductance along the length thereof. The inductance means also includes distributed capacitance between the outer surfaces of the sleeves 29*a*, 29*b* which is a determining factor of the self-resonant frequency of the tuning means 28 when isolated from the transmission line 26. The self-resonant frequency of the sleeves 29*a*, 29*b* and the rod 33, isolated from the transmission line 26, preferably is higher than the highest frequency in the tuning range of the device 24 to maintain the sleeves 29*a*, 29*b* and the rod 33, when isolated from the transmission line 26, inductive over the entire tuning range since self-resonance of the sleeves 29*a*, 29*b* and the rod 33 within the tuning range has been found to cause discontinuities in the tuning characteristic.

The sleeves 29*a*, 29*b* are slidably mounted at one end of the transmission line 26 by means of suitable insulating supports 31*a*, 31*b* and 32*a*, 32*b* of, for example, polystyrene. The rod 33 is connected to a movable tuning rod 34 for sliding the tuning means 28 along the end portion of the transmission line 26, for example, from a position of substantially complete disengagement therewith to a position of complete engagement, indicated by broken lines 36, 36. The rod 34 preferably is mechanically ganged to a tuning element (not shown) of the radio-frequency preselector 11, as indicated by broken line 35, which may include various features similar to those of the tuning means 28 or may be of conventional construction.

It will be understood that capacitance elements 29a, 30a, and 29b, 30b are the electrical equivalent of a single capacitance element preferably having a capacitance variable with displacements of the tuning means 28. The capacitance elements 29a, 30a and 29b, 30b may, therefore, jointly have a combined capacitive reactance of the same order of magnitude as the inductive reactance of the inductance means comprising the sleeves 29a, 29b and the rod 33 at a position of the tuning elements within their range of displacement. By this expression is meant that the combined capacitance elements and the inductance means have effective reactances within a 10:1 range at a resonant frequency of the transmission line within the tuning range thereof corresponding to a position of the tuning elements within their range of displacement. The inductance means 29a, 29b, and 33 and the capacitance elements 29a, 30a and 29b, 30b preferably are series-resonant at a frequency greater than the resonant frequency of the transmission line 26 at each position of the elements within their range of displacement.

At least one of the inductance means 29a, 29b, and 33 and the capacitance elements 29a, 30a and 29b, 30b has a value variable with displacements thereof and the elements have an effective resultant impedance variable with displacements thereof for tuning the transmission line 26 over a wide frequency band. The effective resultant impedance just mentioned is the effective combined impedance of the tuning elements at each displacement thereof and at each corresponding resonant frequency of the transmission line within the tuning range of the device 24, as determined by the frequency displacement tuning characteristic of the device 24. The inductance means may have an effective value which increases as the operating frequency of the device increases because the rod 33 and sleeves 29a, 29b may be self-resonant at a frequency slightly above the tuning range. The capacitance elements 29a, 30a and 29b, 30b preferably have values which increase with displacements thereof toward the transmission line to impart to the device 24 a frequency displacement tuning characteristic such that the resonant frequency of the device decreases with displacements of the tuning elements toward the transmission line 26. The values of the capacitance elements 29a, 30a and 29b, 30b are caused to increase with displacements of the tuning means 28 toward the transmission line 26 by the increase in overlapping areas of the sleeves 29a, 29b, respectively, and the regions 30a, 30b of the transmission-line conductors 26a, 26b. Further, the inner surfaces 29c, 29d of the sleeves 29a, 29b, respectively, preferably are so tapered as to impart to the device 24 a linear frequency displacement tuning characteristic.

*Operation of tuning device of Fig. 1 television receiver*

The operation of the tuning device 24 of the Fig. 1 receiver may be readily understood by referring to Figs. 2–2d, inclusive. Fig. 2 is an equivalent circuit diagram of the tuning device 24 representing the transmission line 26 with the tuning elements 29a, 30a and 29b, 30b, represented as adjustable condensers, connected thereacross in series with a parallel-resonant circuit which represents the inductance of the rod 33 and the sleeves 29a, 29b and the distributed capacitance between the outer surfaces of the sleeves 29a, 29b. The portion of the transmission line 26 comprising the conductors 26a, 26b is represented in solid line in Figs. 2–2d, inclusive, while the portion of the transmission line 26 comprising the circuits of the oscillator 23 which load the transmission line is represented in dot-dash line.

Since the self-resonant frequency of the rod 33 and the sleeves 29a, 29b may, for example, be slightly higher than the highest frequency in the tuning range of the device 24, those elements have an effective inductive reactance over the entire tuning range. In other words, the parallel circuit 28 of Fig. 2 may be considered as the electrical equivalent of a variable inductor having a value which decreases with frequency.

When the device 24 is tuned to the highest frequency in the tuning range thereof by completely disengaging the tuning means 28 from the transmission line 26, the condensers 29a, 30a and 29b, 30b have very small capacitance. Accordingly, the reactance of the condensers 29a, 30a and 29b, 30b is greater than the effective inductive reactance of the rod 33 and the sleeves 29a, 29b and, thus, an effective resultant capacitive reactance is coupled across the end of the transmission line 26. This effective resultant capacitive reactance is the electrical equivalent of an open-ended transmission-line section of length less than one-quarter wave length at the highest frequency $f_a$ in the tuning range of the tuning device 24, as represented in Fig. 2a by a dashed line extension of the transmission line comprising the conductors 26a, 26b and the portion effectively supplied by the oscillator 23.

For some applications, it may be desirable to reduce the condensers 29a, 30a and 29b, 30b to approximately zero capacitance by effectively isolating the tuning means 28 from the transmission line 26. However, at the highest frequency in the tuning range of the device 24, the tuning means 28 may contribute, for example, approximately 10% of the over-all effective length of the transmission line in combination with the tuning means. The tuning device 24 may then be diagrammatically represented, as in Fig. 2a, as an open-ended transmission line having an effective electrical length $\lambda_a/2$ equal to one-half wave length at the highest frequency $f_a$ in the tuning range.

As the tuning means 28 is gradually engaged with the transmission line 26 to a position of complete engagement, represented by broken lines 36, 36 in Fig. 1, a major effect of the engagement is an increase in the value of the condensers 29a, 30a and 29b, 30b and a reduction in the impedance thereof because of the increase in overlapping surface areas of the effective condenser plates 29a, 30a and 29b, 30b. The effective position of the condensers, considered as lumped circuit elements, shifts, but this effect is secondary and, for the sake of simplicity, will not be considered in the following explanation.

Because of the values of the capacitance elements 29a, 30a and 29b, 30b relative to the effective variable inductance presented by the sleeves 29a, 29b and the rod 33, over the displacement range of the tuning means 28, the reactance of the condensers remains greater than the effective inductive reactance of the sleeves 29a, 29b and the rod 33 over the entire displacement range and, thus, an effective resultant capacitive reactance is coupled across the end of the transmission line 26 at the lowest frequency $f_b$ in the tuning range. This effective resultant capacitive reactance is the electrical equivalent of an open-ended transmission-line section of length less than one-quarter wave length at frequency $f_b$, as represented in Fig. 2b by a dashed line extension of the transmission line comprising the conductors 26a, 26b and the portion effectively supplied by the oscillator 23. As indicated in dot-dash line in Fig. 2b, the length of the transmission line represented by the oscillator 23 increases slightly in effective inch measurement at the frequency $f_b$. The effectively extended transmission line then has an effective electrical length $\lambda_b/2$ equal to one-half wave length at the frequency $f_b$.

Thus, as the tuning means 28 is displaced from a position of complete disengagement with the transmission line 26 to a position of complete engagement therewith, the resonant frequency of the tuning device 24 decreases. By properly tapering the inner surfaces of the sleeves 29a, 29b of the Fig. 1 device, a substantially linearly decreasing frequency displacement tuning characteristic may be imparted to the tuning device 24 as the tuning means moves toward the transmission line. This is because the taper of the sleeves 29*a*, 29*b* controls the rate of change of capacitance with respect to displacement of the tuning means along the transmission line and, thus, controls the effective resultant impedance of the tuning elements across the transmission line at each displacement of the tuning means.

Figs. 2*c* and 2*d* represent the tuning device 24 when utilizing a tuning means of construction similar to that of the tuning means 28 but including, for example, sleeves having inner surfaces of greater taper than the surfaces 29*c*, 29*d* and providing greater maximum capacitance in cooperation with the transmission-line conductors. The device 24 then operates at frequencies below the tuning range provided by the tuning means 28 for reasons more fully explained hereinafter. Such a tuning means corresponds diagrammatically with the tuning means 28, the physical tuning means differing solely in the taper of the inner surfaces of the capacitive sleeves thereof, as mentioned previously. Fig. 2*c* represents the tuning device 24 utilizing the tuning means just described displaced to an intermediate position in the displacement range thereof. Under this operating condition, the value of the capacitance elements comprising the conductive sleeves in cooperation with the transmission-line conductors is sufficient to decrease the capacitive reactance of the capacitance elements to equality with the effective inductive reactance of the inductance means comprising the sleeves and rod connected therebetween at an operating frequency $f_c$ of the device 24 and render the tuning means series-resonant at the frequency $f_c$.

When the tuning means is series-resonant, the tuning means effectively becomes a short-circuit across the end of the transmission line 26, causing the line to resonate as a short-circuited one-quarter wave-length line $\lambda_c/4$. The effectively short-circuited one-quarter wave-length line may also be considered as a one-half wave-length open-ended transmission line of length $\lambda_c/2$, as indicated in Fig. 2*c*. If the oscillator loading were constant, the frequency of series resonance would be one-half the highest frequency in the tuning range with the tuning means disengaged from the transmission line and effectively isolated therefrom. Because of the increase in oscillator loading and effective additional extension of the transmission line 26 at lower frequencies, however, the frequency of series resonance is less than one-half the highest frequency in the tuning range.

As the tuning means now being considered is further engaged with the transmission line 26 to, for example, a position of complete engagement, represented by broken lines 36, 36 in Fig. 1, the resonant frequency of the tuning device continues to decrease to, for example, a frequency $f_d$. After the tuning means passes through series resonance, the effective inductive reactance thereof is greater than the capacitive reactance thereof because of the increase in value of the capacitance elements. Accordingly, the tuning means may be effectively represented in this tuning region as a short-circuited extension of the transmission line 26. As indicated in dashed line in Fig. 2*d*, the transmission line 26 then operates as a short-circuited one-quarter wave-length line $\lambda_d/4$ having a resonant frequency $f_d$ and may also be considered as an open-ended one-half wave-length line of length $\lambda_d/2$.

While applicant does not wish to be limited to any particular circuit constants, the following have been employed in a tuning device constructed in accordance with the invention:

| | |
|---|---|
| Tuning range of device **24** | Approximately 500–950 megacycles. |
| Diameter of conductors **26***a*, **26***b* | .1875 inch. |
| Length of conductors **26***a*, **26***b* | 2½ inches. |
| Spacing of conductors **26***a*, **26***b* | 19/32 inch. |
| Characteristic impedance of transmission line **26** | Approximately 200 ohms. |

| | |
|---|---|
| Length of sleeves **29***a*, **29***b* | 1 inch. |

Inner diameter of sleeves 29*a*, 29*b* at 1/16 inch spacings:

| Distance | Diam., inches | Distance | Diam., inches | Distance | Diam., inches |
|---|---|---|---|---|---|
| 0 | .203 | 6 | .223 | 12 | .320 |
| 1 | .203 | 7 | .231 | 13 | .350 |
| 2 | .204 | 8 | .244 | 14 | .395 |
| 3 | .207 | 9 | .257 | 15 | .459 |
| 4 | .211 | 10 | .274 | 16 | .484 |
| 5 | .216 | 11 | .296 | | |

| | |
|---|---|
| Diameter of rod **33** | 1/16 inch. |
| Length of rod **33** | Approximately 19/32 inch. |
| Effective inductance of tuning means **28** over tuning range of device **24** | Approximately .01–.07 microhenry. |
| Capacitance between outer surfaces of sleeves **29***a*, **29***b* | Approximately 2 micromicrofarads. |
| Self-resonant frequency of sleeves **29***a*, **29***b* and rod **33** | Approximately 1100 megacycles. |
| Combined capacitance range of condensers **29***a*, **30***a* and **29***b*, **30***b* | Approximately .15–3 micromicrofarads. |
| Material of conductors **26***a*, **26***b*, sleeves **29***a*, **29***b*, and rod **33** | Silver-plated brass. |

From the foregoing description it should be apparent that a high-frequency wave-signal tuning device constructed in accordance with the invention has several advantages. In the first place, the device is capable of providing a linear frequency displacement tuning characteristic over a wide frequency band and has reduced criticalness of design. Further, the device utilizes the entire length of the transmission line at each displacement of the tuning means and thereby reduces any tendency of the transmission line to oscillate in an undesired mode. Additionally, the resonant frequency of the device decreases as the tuning means moves toward the transmission line providing a frequency displacement characteristic having a slope of opposite sign to that provided by conventional tuning devices and which may be desirable for applications involving, for example, cooperation with a tuning device operating over a different frequency band and having a similar frequency displacement characteristic.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A high-frequency wave-signal tuning device tunable over a wide frequency band comprising: a high-frequency wave-signal transmission line having an effective electrical length approximately equal to one-half wave length at the highest frequency in said frequency band and including a pair of substantially parallel elongated conductors having an open end portion; a pair of tapered conductive sleeves longitudinally displaceable along said open end portion of said conductors and at least semidisengageable therewith and comprising inductance elements having distributed capacitance therebetween and distributed inductance along the length thereof; and a conductive inductance element connected to one end of each of said sleeves, said inductance elements having a self-resonant frequency higher than said highest frequency in said frequency band; said sleeves also comprising, in cooperation with said conductors, capacitance elements series-resonant with said inductance elements at a variable frequency greater than the resonant frequency of said transmission line at each position of said inductance and capacitance elements within their range of displacement, said capacitance elements having a capacitance which increases with displacements thereof toward said transmission line, and said inductance and capacitance elements having an effective resultant impedance variable with displacements thereof to impart to the device a linear frequency displacement tuning characteristic such that frequency decreases with displacements of said elements toward said transmission line for tuning said transmission line over said wide frequency band.

2. A high-frequency wave-signal tuning device tunable over a wide frequency band comprising: a high-frequency wave-signal transmission line including a pair of substantially parallel elongated conductors having an open end portion; a pair of tapered conductive sleeves longitudinally displaceable along said open end portion of said conductors and at least semidisengageable therewith and comprising inductance elements having distributed capacitance therebetween and distributed inductance along the length thereof; and a conductive inductance element connected to one end of each of said sleeves, said inductance elements having a self-resonant frequency higher than the highest frequency in said frequency band; said sleeves also comprising, in cooperation with said conductors, capacitance elements having an effective capacitive reactance of the same order of magnitude as the effective inductive reactance of said inductance elements at a position of said inductance and capacitance elements within their range of displacement, at least one of said inductance and capacitance elements having a value variable with displacements thereof, and said inductance and capacitance elements having an effective resultant impedance variable with displacements thereof for tuning said transmission line over said wide frequency band.

3. A high-frequency wave-signal tuning device tunable over a wide frequency band comprising: a high-frequency wave-signal transmission line including a pair of substantially parallel elongated conductors having an open end portion; a pair of tapered conductive sleeves longitudinally displaceable along said open end portion of said conductor and at least semidisengageable therewith and comprising inductance elements having distributed capacitance therebetween and distributed inductance along the length thereof; and a conductive inductance element connected to one end of each of said sleeves, said inductance elements having a self-resonant frequency higher than the highest frequency in said frequency band; said sleeves also comprising, in cooperation with said conductors, capacitance elements having an effective capacitive reactance of the same order of magnitude as the effective inductive reactance of said inductance elements at a position of said inductance and capacitance elements within their range of displacement, said capacitance elements having a capacitance variable with displacements thereof, and said inductance and capacitance elements having an effective resultant impedance variable with displacements thereof, and said sleeves being so tapered as to impart to the device a linear frequency displacement tuning characteristic for tuning said transmission line over said wide frequency band.

References Cited in the file of this patent

UNITED STATES PATENTS

| | | |
|---|---|---|
| 2,286,428 | Mehler | June 16, 1942 |
| 2,408,895 | Turner | Oct. 8, 1946 |
| 2,427,110 | Selby | Sept. 9, 1947 |
| 2,435,442 | Gurewitsch | Feb. 3, 1948 |
| 2,475,198 | Reinschmidt | July 5, 1949 |
| 2,557,686 | Rado | June 19, 1951 |
| 2,627,550 | Rose | Feb. 3, 1953 |
| 2,715,211 | Murakami | Aug. 9, 1955 |

FOREIGN PATENTS

| | | |
|---|---|---|
| 122,191 | Australia | Sept. 4, 1946 |

OTHER REFERENCES

Lindeman et al.: Proceedings of the I. R. E., vol. 41, No. 1, January 1953, pages 67–72. 333–82A.